United States Patent
Yoshii et al.

(10) Patent No.: US 6,250,990 B1
(45) Date of Patent: Jun. 26, 2001

(54) CSP PLATE CUTTING APPARATUS

(75) Inventors: Masahiro Yoshii; Shinichi Namioka; Masakado Kamigaki, all of Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/432,183

(22) Filed: Nov. 2, 1999

(30) Foreign Application Priority Data

Nov. 6, 1998 (JP) .................................................. 10-315975
Jul. 9, 1999 (JP) .................................................. 11-195719

(51) Int. Cl.$^7$ .................................................. B24B 49/00
(52) U.S. Cl. .................................. 451/5; 451/10; 451/11; 125/13.01; 125/23.01
(58) Field of Search .................................... 125/12, 13.01, 125/23.01; 451/5, 8, 9, 10, 11, 41; 83/76.8, 79, 80, 100, 167

(56) References Cited

U.S. PATENT DOCUMENTS 5,842,461 * 12/1998 Azuma .............................. 125/13.01
6,102,023 * 8/2000 Ishiwata et al. ................... 125/13.01

FOREIGN PATENT DOCUMENTS 11-267940 * 10/1999 (JP) .

* cited by examiner

*Primary Examiner*—M. Rachuba
(74) *Attorney, Agent, or Firm*—Arent Fox Kintner Plotkin & Kahn, PLLC

(57) ABSTRACT

An apparatus for cutting CSP plates into individual pellets to put them on carrier trays for transportation includes a jig rack for the storing of jigs for holding CSP plates. A taking-in and -out table takes a selected jig out from the jig rack to transport it to an area in which CSP plates are brought and laid. The apparatus also includes a cassette table on which a CSP plate cassette is put. The selected CSP plate is taken out from the cassette and is put on an associated jig, which is laid on the table. A first transport transports the CSP plate-and-jig combination from the taking-in and -out table to a working table. The CSP plate is cut with a cutting blade, while the CSP plate-and-jig combination is held on the working table. The CSP plate is cut into individual pellets. A second transport transports the jig holding the CSP plate from the working table to a washing table where the cut CSP plate-and-jig combination are washed. A third transport transports the washed cut CSP plate-and-jig combination from the washing table to a pellet picking-up table. Individual pellets are picked up from the pellet picking-up table and put in carrier trays, which are laid in a pellet transferring area. A fourth transport transports empty jigs from the pellet picking-up table to the jig taking-in and -out table.

4 Claims, 6 Drawing Sheets

CSP PLATE CUTTING APPARATUS

BACKGROUND OF THE INVENTION

1. Field of the Invention

The present invention relates to an apparatus for cutting and separating (hereinafter referred as "pelletizing") CSP plates into their individual chip scale packages (abbreviated as CSPs) or pellets to put them on carrier trays for transportation.

2. Related Arts

Referring to FIG. 8, a chip size package plate (abbreviated as CSP plate) 100 is composed of a lattice arrangement of semiconductor chips lined with epoxy or any other resin material in sealed integral form, which can be separated into a plurality of CSPs or pellets by cutting along crosswise cutting lines 101 and 102.

Referring to FIG. 9, CSP plates 100 can be pelletized with a conventional dicing apparatus 110, which is usually used in dicing semiconductor wafers. A plurality of CSP plates 100 each attached to a carrier F by means of adhesive tape T, are stored in a cassette 111.

CSP plates 100 are taken out one after another by the taking-out means 112, and then a selected CSP plate is sucked and held on the first transporting means 113. When the first transporting means 113 turns toward the chuck table 114, the CSP plate 100 is released and laid on the chuck table 114 where it is sucked and fixedly held.

The chuck table 114 is moved in the X-axial direction to the orientation stage where a picture of the CSP plate 100 is taken to locate its cutting lines 101 and 102 with the aid of the alignment means 116. Then, the chuck table 114 is moved in the X-axial direction to permit the cutting means 118 to cut the CSP plate 100 along a selected longitudinal cutting line 101 with the cutting blade 117.

After cutting the CSP plate 100 along all longitudinal cutting lines 101, the chuck table 114 is rotated 90 degrees, and then the CSP plate 100 is cut along its lateral cutting lines 102. When the CSP plate 100 is cut along all lateral cutting lines 102, it is separated into a plurality of individual CSPs or pellets.

After being pelletized, the CSP plate 100 which has its individual pellets retained thereon, is transported to the washing area 120 where the separated CSP plate 100 is washed and dried, and then, the separated CSP plate is taken in the cassette 111 with the taking-in means 112. Thus, the cassette 111 loaded with pelletized CSP plates, each lined with adhesive tape T and supported by an associated carrier F, is removed from the dicing apparatus 110. Later, individual CSPs are put in carrier trays to be arranged at regular intervals therein, and the carrier trays thus loaded with individual CSPs are shipped or transported to assembling lines in the factory.

After dicing semiconductor wafers, the so produced pellets must be subjected to wire-bonding, packaging and other processing before providing commercial products. Different from such semiconductor wafers CSP plates can be advantageously commercial products simply by pelletizing. It is, however, necessary that such pellets are put in carrier trays for shipping or transporting to the assembling lines of an electronics manufacturing factories.

If the dicing apparatus 110 is used in pelletizing CSP plates, the plates can be pelletized, and the so pelletized CSP plates can be put in the cassette, but disadvantageously individual CSPs cannot be put in carrier trays for shipping. For that purpose it is necessary that such individual pellets be transported to a loading stage where they are put in carrier trays by using loading means. This requires not only such extra loading means but also operators engaging in loading work.

SUMMARY OF THE INVENTION

One object of the present invention is to provide an apparatus which is capable of pelletizing CSP plates and loading carrier trays with individual CSPs or pellets for shipping, thereby improving the productivity of CSPs and substantially reducing the cost involved for packaging for shipping.

To attain this object according to the present invention an apparatus for dicing CSP plates into individual pellets to put them on carrier trays for transportation comprises at least: a jig rack for storing a plurality of jigs for holding CSP plates; table means for taking a selected jig out from the jig rack to carry and transport it to a CSP plate Storage area in which CSP plates are brought and laid one after another; a cassette table on which a CSP plate cassette is put; means for taking a selected CSP plate out from the cassette; means for putting the so taken-out, selected CSP plate on an associated jig, which is laid on the jig taking-out table means; first transporting means for transporting the CSP plate-and-jig combination from the jig taking-out table means to a working table; means for cutting and separating the CSP plate with a cutting blade, the CSP plate-and-jig combination being held on the working table; second transporting means for transporting the jig holding its CSP plate cut and separated into individual pellets from the working table to a washing table; third transporting means for transporting the so washed cut CSP plate-and-jig combination from the washing table to a pellet picking-up table; means for picking up individual pellets from the pellet picking-up table to put them in carrier trays, which are laid in a pellet transferring area; and fourth transporting means for transporting empty jigs from the pellet picking-up table to the jig taking-out table means.

With this arrangement CSP plates can be pelletized and carrier trays can be loaded with CSPs or pellets in one and same apparatus, requiring neither extra loading site nor operators engaging in loading work.

The pelletizing-and-loading apparatus may further comprise:

a first tray rack for storing empty carrier trays; a second tray rack for storing pellet-loaded carrier trays; a first tray- carrying table for transporting empty carrier trays from the first tray rack to the pellet transferring area; a second tray-carrying table for transporting pellet-loaded carrier trays to the second tray track; and means for transferring pellet-loaded carrier trays from the first tray-carrying table to the second tray-carrying table.

Each jig may have slots or grooves made in the form of lattice on its surface, thereby allowing the cutting blade to traverse the jig without being caught when the overlying CSP plate is being cut, each square defined by the lattice pattern having a first suction through-hole and second suction holes made therein, the first suction through-hole passing through the thickness of the jig to communicate with a suction source provided to the working table, whereas the second suction holes communicate with vent holes made on selected sides of the jig for inserting suction pipes extending from the suction source via the conduit passages made in the first, second and third transporting means, thereby permitting the CSP plate to be held on the jig by suction.

The suction pipes extending from the first, second and third transporting means are adapted to apply negative pressure to selected CSP plates and at the same time, physically pinch the jig therebetween for holding the same.

Other objects and advantages of the present invention will be understood from the following description of a cutting-and- loading apparatus according to one embodiment of the present invention, which is shown in accompanying drawings.

DETAILED DESCRIPTION OF PREFERRED EMBODIMENT

Figure 1:
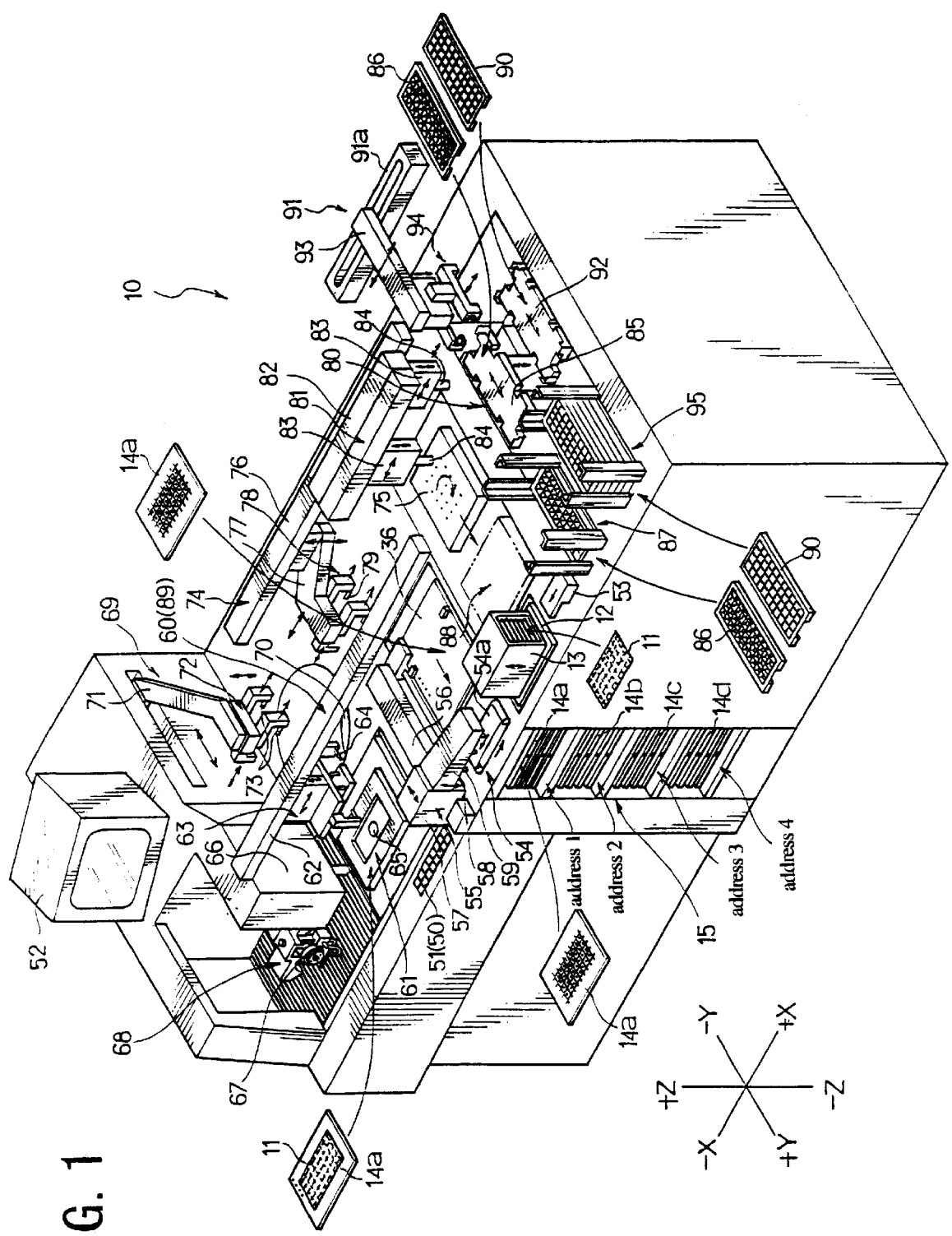
FIG. 1 is a perspective view of a cutting-and-loading apparatus according to the present invention.

FIG. 1 shows an apparatus 10 for cutting and separating CSP plates into individual CSPs or pellets to put them on carrier trays for transportation. CSP plates 11 to be cut are contained in a cassette 13, and the cassette 13 loaded with CSP plates 11 is put on a cassette table 12, which can be raised or lowered.

A jig rack 15 is loaded with a plurality of jigs 14 of different types. Each jig 14 is used to support a selected CSP plate 11 while being cut. In FIG. 1 four jigs each of different kinds 14a, 14b, 14c and 14d are stored at different addresses, i.e., Nos. 1, 2, 3 and 4 respectively in the jig rack 15. Each kind of jig is designed to permit a selected type of CSP plate to be fitted thereon. Specifically the jig has slots made in the form of lattice, and such slots are dimensioned to meet a selected type of CSP plate in terms of its size, thickness and pellet size, thereby not causing the cutting blade to be caught by the underlying support while the overlying CSP plate is being cut.

Figure 2:
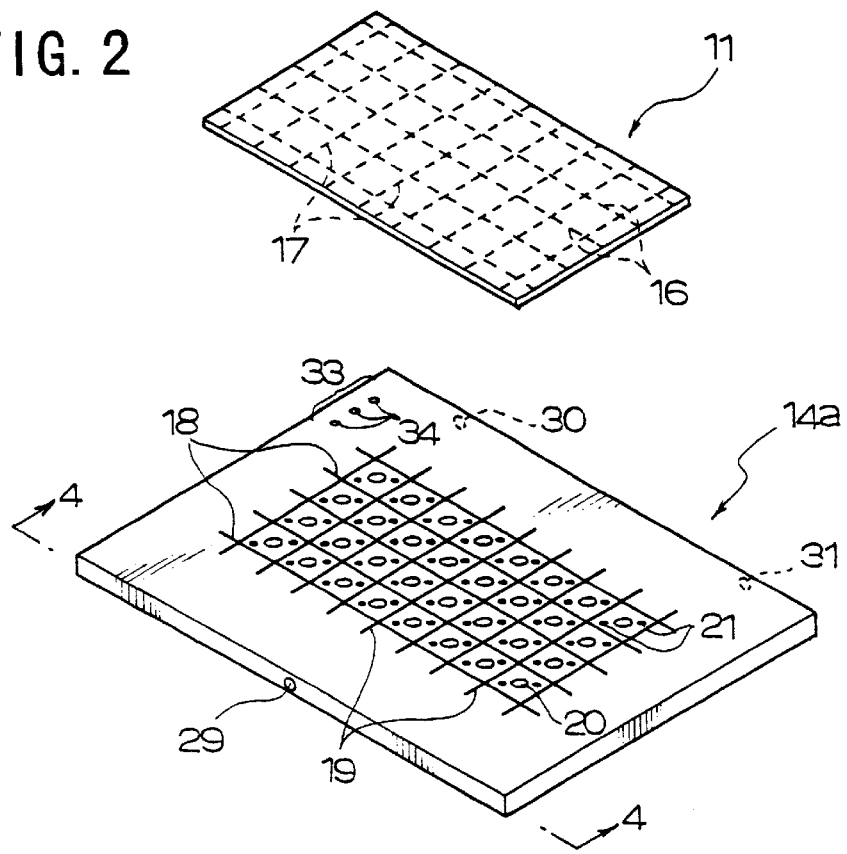
FIG. 2 is a perspective view of one example each of a CSP plate and an associated jig for supporting the CSP plate.
Figure 3:
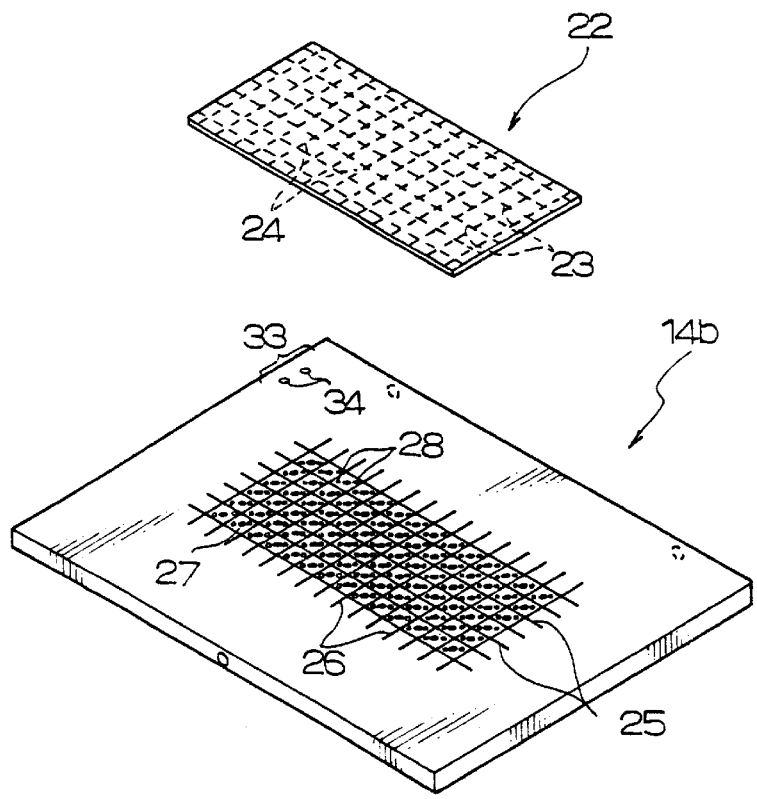
FIG. 3 is a perspective view of another example each of a CSP plate and an associated jig for supporting the CSP plate.

As seen from FIG. 2, the CSP plate 11 is flat, and can be separated into a plurality of individual CSPs by cutting crosswise along cutting lines 16 and 17. The jig 14a is a flat plate, and is designed to support the CSP plate on its rear side while and even after being cut and separated. Specifically the flat plate 14a has a lattice pattern of slots 18 and 19 corresponding to the lattice pattern of cutting lines 16, 17 of the overlying CSP plate 11, and each square has one first suction hole 20 at its center and two second suction holes 21 diagonally made therein. FIG. 3 shows another example each of CSP plate 22 and jig 14b. The CSP plate have numerous cutting lines 23, 24, and the jig has numerous slots 25, 26, and suction holes 27, 28, compared with those of FIG. 2, accordingly providing much more pellets.

Figure 4:
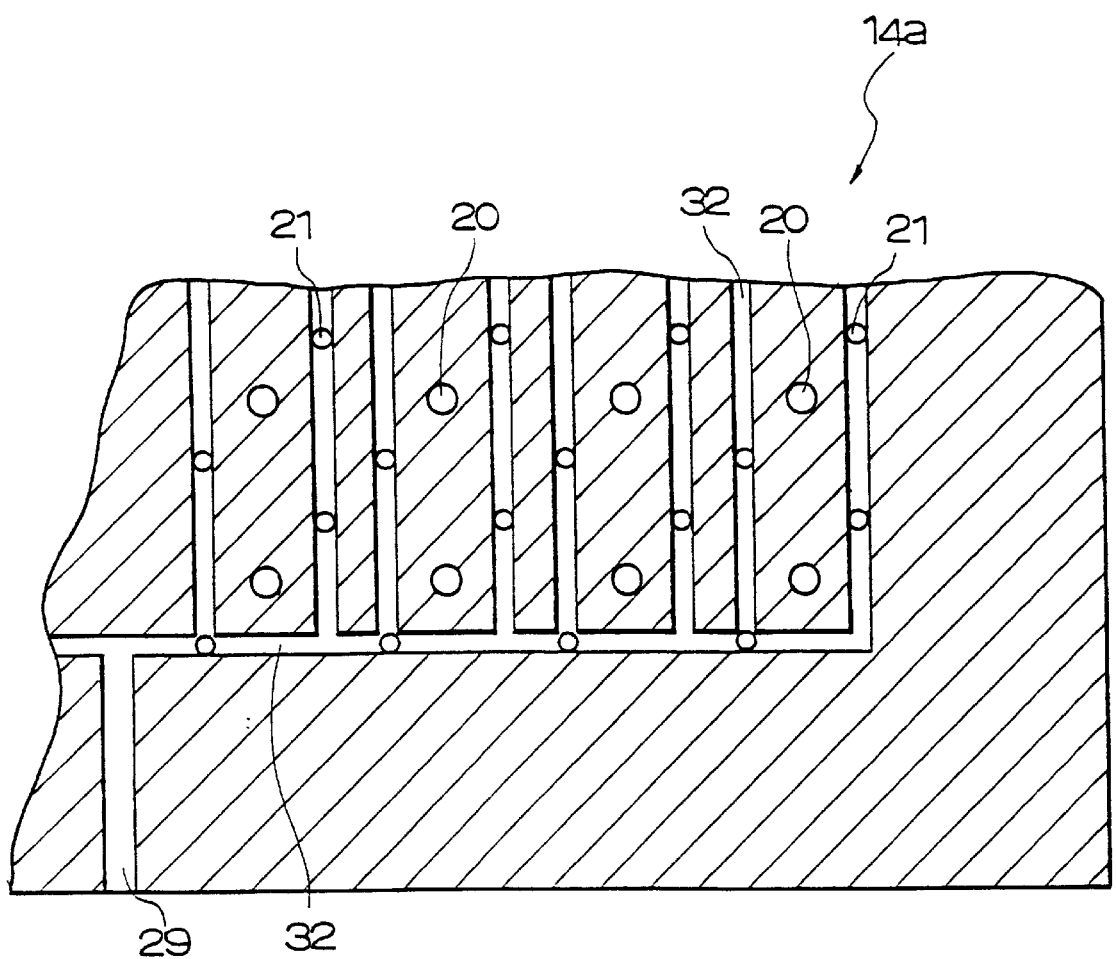
FIG. 4 is an enlarged sectional view of a fragment of the jig taken along the line 4—4 in FIG. 2.

Referring to FIG. 2 again, the jig 14a has three vent holes 29, 30 and 31 made in its longitudinal opposite sides. These vent holes 29, 30 and 31 are adapted to accommodate first, second and third suction pipes 64, 73 and 79 extending from first transporting means 60, second transporting means 69 and third transporting means 74 respectively, as described later in detail. Referring to FIG. 4, each of the first suction holes 20 passes through the thickness of the jig 14a, and each of the second suction holes 21 communicate with the vent holes 29, 30 and 31 via conduit passages 32 made within the jig 14a.

Each jig has an identification mark 33 on its surface. The identification mark 33 is given in the linear arrangement of apertures 34 made at one corner of the jig, as for instance, the identification mark 33 is given by three apertures 34 lined in the jig 14a of FIG. 2, and the identification mark 34 is given by two apertures 34 lined at one corner of the jig 14b of FIG. 3, In stead of such apertures bar codes may be used as an identification mark.

Figure 5A:
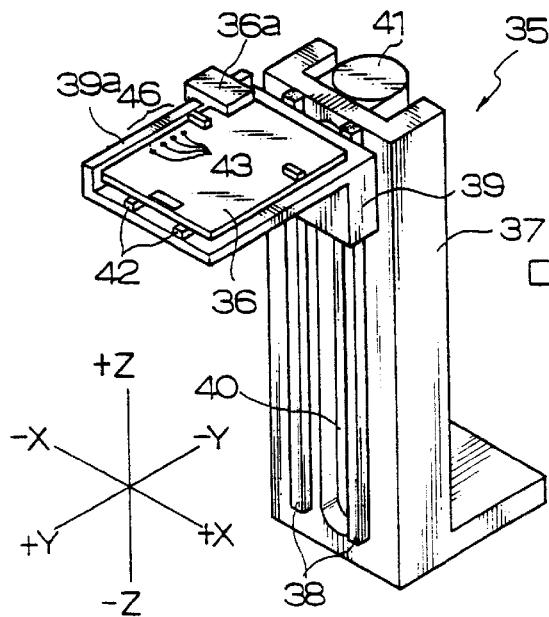
FIG. 5A through 5D are a series of perspective views showing how jigs can be taken out.

Referring to FIG. 5(A), a jig taking in-and-taking out unit 35 takes a selected jig out from the jig rack 15. The jig taking in-and-taking out unit 35 includes an upright wall 37 having a pair of first, vertical guide rails 38 parallel-arranged on its front side and a vertical slot 40 made between the opposite guide rails 38, and a table support 39 slidably riding on the opposite guide rails 38. The table support 39 has its tail projection passing through the vertical slot 40 and threadedly engaged with a vertical screw rod (not shown) on the rear side of the upright wall 37. A motor drive 41 has its shaft connected to the vertical screw rod, and the table support 39 moves up or down along the first guide rails 38 when the motor drive 41 is rotated in one or the other direction.

The table support 39 has a pair of second, horizontal guide rails 42 laid on its surface in the Y-axial direction, and a jig table 36 rides slidably on the horizontal guide rails 42, and a table drive 36a is fixed to one longitudinal side of the table support 39 for driving the jig table 36 on the second guide rails 42 in the Y-axial direction. The jig table 36 is equipped with detector means 46 for detecting the identification mark 33 of a selected jig 14 on the jig table 36. The detector means 46 is a linear array of four optical sensors 43, each composed of a light-emitting element and a light-receiving element. The detector means 46 is used in making a decision as to whether or not a selected jig is in conformity with a CSP plate selected for cutting.

Figure 5B:
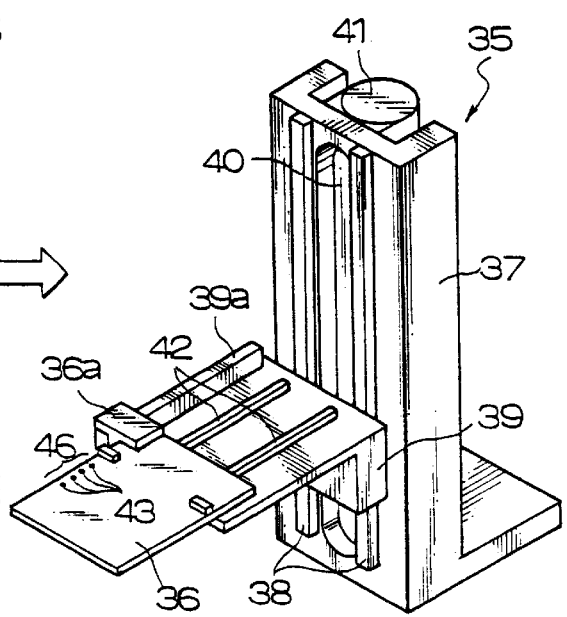

Assume that one of the jigs 14a is selected and taken out from the jig rack 15 by using the jig taking-in and -out means 35. The table support 39 moves up and down to be at a level which is somewhat lower than the level at which a selected jig 14a is stored. As shown in FIG. 5(B), the jig table 36 is moved in the +Y axial direction to crawl under the selected jig 14a, making a decision as to whether the selected jig 14a is in conformity with the CSP plate selected for cutting.

Figure 6:
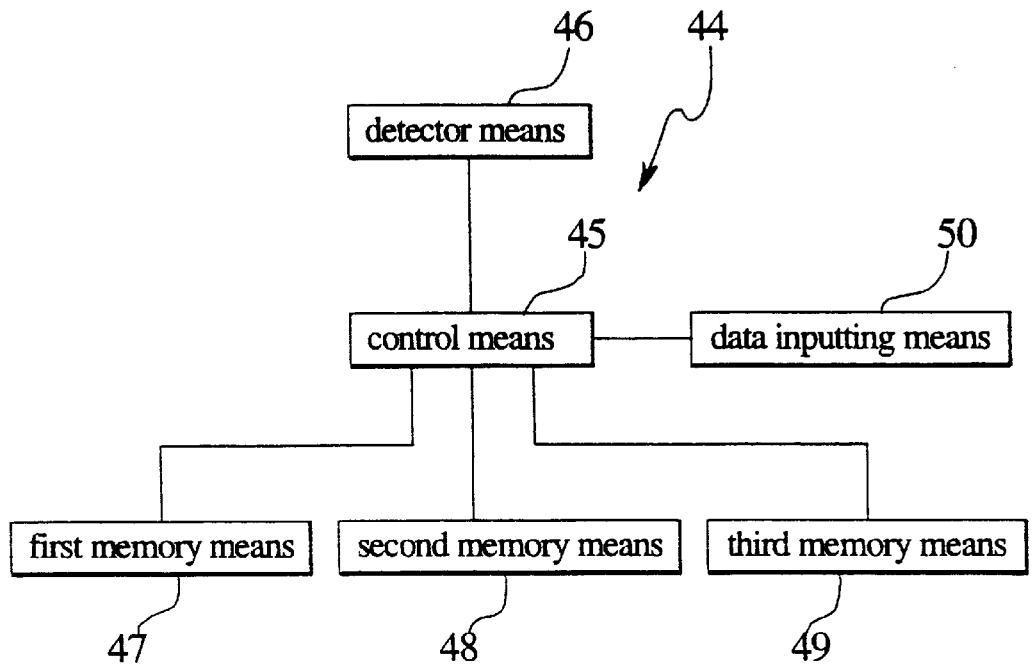
FIG. 6 illustrates means for making a decision as to whether or not a correct jig is selected for a given CSP plate.

Referring to FIG. 6, a decision making unit 44 comprises a key-board, a CPU, memories and other electronics units. The drawing illustrates functional blocks, i.e., control means 45, detector means 46, first memory means 47, second memory means 48, third memory means 49 and data inputting means 50.

The control means 45 performs required controls on the processing of data from the data inputting means 50, the storing and retrieving of data from each memory means, the making of data comparison between selected memories, the making of decision and other functions.

The detector means 46 may be optical sensors if the identification marks are given in the form of apertures (FIG. 5), or a bar code reader if the identification marks are given in the form of bar codes.

The first memory means 47 stores the identification number representing the particular type of CSP plates to be cut, as shown in the following Table 1.

TABLE 1

| Identity Number of CSP plate | Identity Number of CSP plate | Identity Number of CSP plate | Identity Number of CSP plate | Identity Number of CSP plate |
|---|---|---|---|---|
| 001 | | | | |

The operator inputs the identification number by the data inputting means 50. From the identification number the size of the CSP plate, the thickness of the CSP plate, the size of pellet and other particulars can be determined from the contents of the second memory means 48. The identification number is a three-digit number. For example in the Table 1, the operator inputs the identification number 001 to be stored in the first memory means 47, indicating that CSP plates whose identification number is 001 are to be cut.

The second memory means 48 stores a reference table showing which CSP identification number corresponds to which jig mark and aperture number; what address of the jig rack the jig of desired type is stored; and what size the pellet has and how many pellets are arranged longitudinally and laterally, for instance as shown in the following Table 2.

TABLE 2

| CSP Plates' Identity Nos. | Jigs' Identity Marks; Number of Apetures | Addresses in Jig Rack | Pellet Size and Other Particulars |
|---|---|---|---|
| 001 | A, 3 | 1-1 | 10 mm square |
| | | 1-2 | |
| | | 1-3 | 4 pieces arranged |
| | | 1-4 | laterally and 8 pieces longitudinally |
| 002 | B, 2 | 2-1 | 5 mm square |
| | | 2-2 | |
| | | 2-3 | 6 pieces arranged |
| | | 2-4 | laterally and 14 pieces longitudinally |
| 003 | C, 1 | 3-1 | |
| | | 3-2 | |
| | | 3-3 | |
| | | 3-4 | |
| 004 | D, 0 | 4-1 | |
| | | 4-2 | |
| | | 4-3 | |
| | | 4-4 | |

CSP plates of identification number 002 conform with jigs of identification mark B (aperture number: 2), which jigs are stored at address Nos. 2-1, 2-2, 2-3 and 2-4 of the jig rack 15. Each pellet from 002 CSP plates is a square with one side 5 mm long, and the 002 CSP plate can be divided into 6 times 14 pellets.

The third memory means 49 stores the identification mark of a selected jig, which is being taken out by the jig taking in- and -out table 36, as shown in the following Table 3.

TABLE 3

| Detected Results |
|---|
| A, 3 |

The identification mark 33 of the jig is detected by the detecting means 46, as described above.

Data to be stored in the first memory means 47 and the second memory means 48 are inputted by using the data inputting means 50, which may be a key-board 51 on the front edge of the CSP plate pelletizing-and-loading apparatus 10 of FIG. 1.

The decision making means 44 permits the operator to store the identification number of CSP plates 11 to be pelletized, for example 001 in the first memory means 47.

As seen from FIG. 5(B), when the jig table 36 is made to crawl under a selected jig 14a (type A) in the jig rack 15, the detecting means 46 detects it in terms of the number of its identification apertures, and the identification aperture number thus detected and stored in the third memory means 49.

As seen from FIG. 5(A), the light emitting elements 43 throw their beams of light to the apertures 34 of the overlying jig 36. The beam of light which is directed to the aperture-free area is reflected without losing its strength of brightness whereas the beam of light which is directed to a selected aperture is allowed to pass therethrough, causing little or no reflection. Thus, the apertures 34 made in the selected jig 36 can be counted in terms of reflections.

Referring to FIGS. 2 and 3 again, the jig 14a of Type A has three apertures 34 made at one corner whereas the jig 14b of Type B has two apertures 34 made at one corner. Assume that the jig 14c of Type C has one aperture 34 made at one corner, and that the jig 14d of Type D has no aperture 34 made therein. If a selected jig 14a of Type A is laid on the jig taking in-and -out table 36, and if the four beams of light directed from the four light emitting elements 43 (FIG. 5A) to the three apertures of the jig 14a of Type A, the three beams of light are reflected with minimum strength of brightness whereas the remaining one beam of light is reflected without losing its strength of brightness. Thus, the apertures 34 can be counted to be three, thus identifying the overlying jig 14a as Type A, and the result of identification is stored as A; 3 in the third memory means 49.

After identifying the overlying jig 14a to store in the third memory means 49, the piece of information indicating what type of jig is laid on the jig taking in- and -out table 36, the control 45 makes a decision as to whether or not the contents of the first and third memory means 47 and 49 meet the corresponding relation stored in the second memory means 48.

Specifically the content of the first memory means 47 (i.e. the type of CSP plate) is 001, and the content of the third memory means 49 (i.e. the type of jig) is A, and then, the corresponding relation is 001 v. A as stored in the second memory means 48. When the correspondence is confirmed to be held, the overlying jig 14a is determined to be used in holding the CSP plate of identification number 001.

Figure 5D:
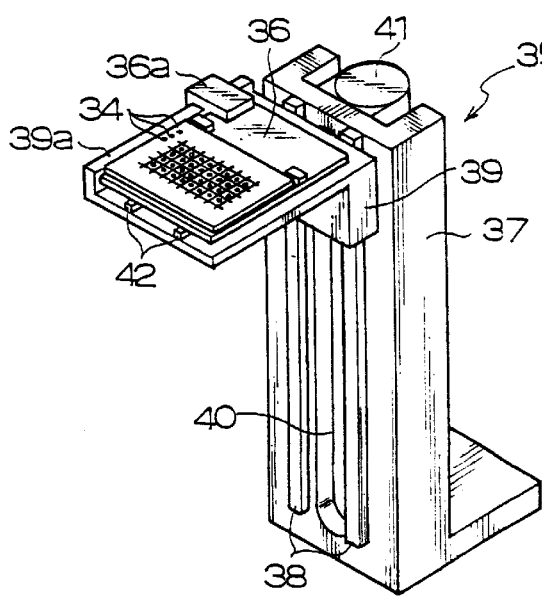
Figure 5C:
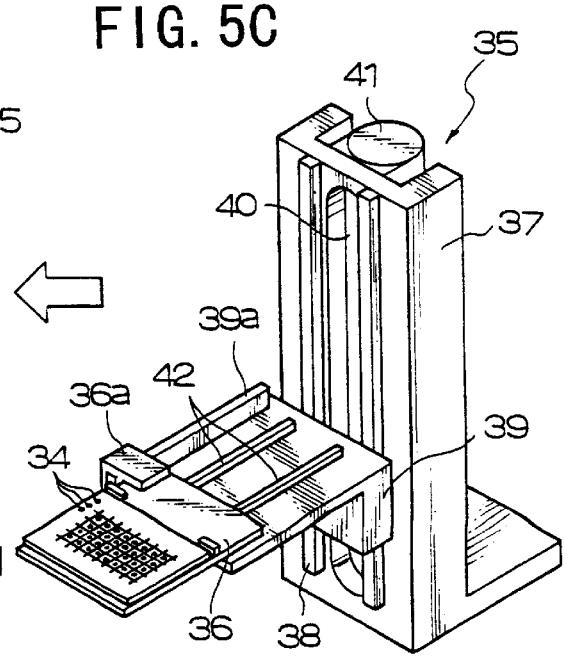

The table support 39 is raised a little to support the jig 14a thereon (see FIG. 5C), and then, the jig taking in- and -out table 36 is moved in the Y-axial direction to take the jig 14a out of the jig rack 15. Then, the table support 39 is raised up to the highest level as shown in FIG. 5(D) so that the jig taking in- and -out table 36 appears on the CSP plate pelletizing-and-loading apparatus 10.

On the contrary if the contents of the first and second memory means 47 and 49 fail to meet the corresponding relation stored in the second memory means 48, the overlying jig 14a is determined to be useless in holding the CSP plate 11, informing the operator of this fact on the monitor display 52.

Even if a selected jig is stored at a wrong address in the jig rack, the jig cannot be used in holding the counter CSP plate, thus avoiding the situation in which: the cutting blade is damaged by being caught by the underlying jig, which has no correct lattice pattern of slots relative to the lattice pattern of the overlying CSP plate; or the CSP plate is damaged by the cutting blade as a result of the offsetting of the lattice patterns of the CSP plate and jig.

Thus, the jig 14a which conforms the CSP plate 11 to be pelletized is selected without fail, and the correct jig 14a is put on the jig taking in- and -out table 36. On the other hand, the CSP plate 11 is pushed out from the cassette 12 by the CSP plate taking-out means 53 in the X-axial direction to be put on an endless belt 54a in the tentative storage area 54.

The belt 54a moves in the X-axial direction so that the CSP plate 11 is put at a predetermined position relative to an overlying CSP plate carrier 55. Then, the CSP plate 11 is transferred to the jig 14a on the jig taking out- and -in table 36 by the CSP plate carrier 55.

Figure 7:
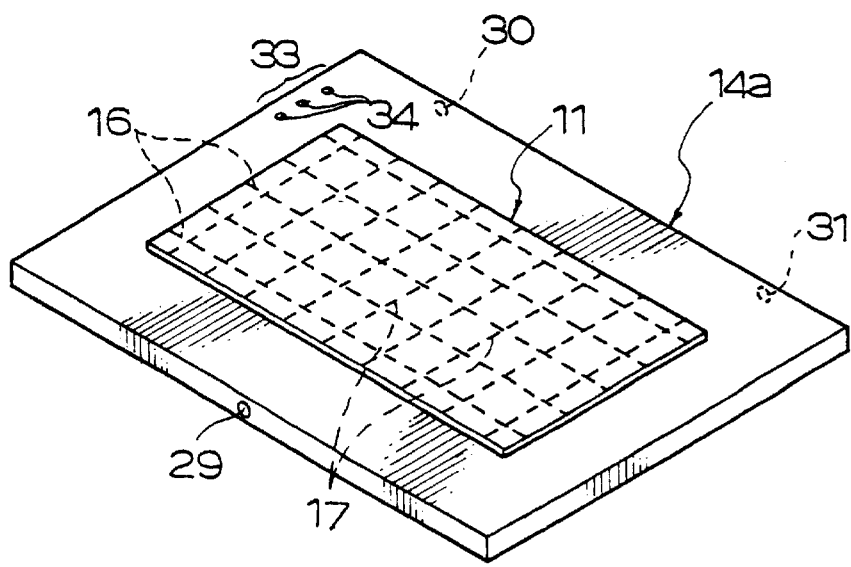
FIG. 7 is a perspective view of a CSP plate-and-jig set.
Figure 8:
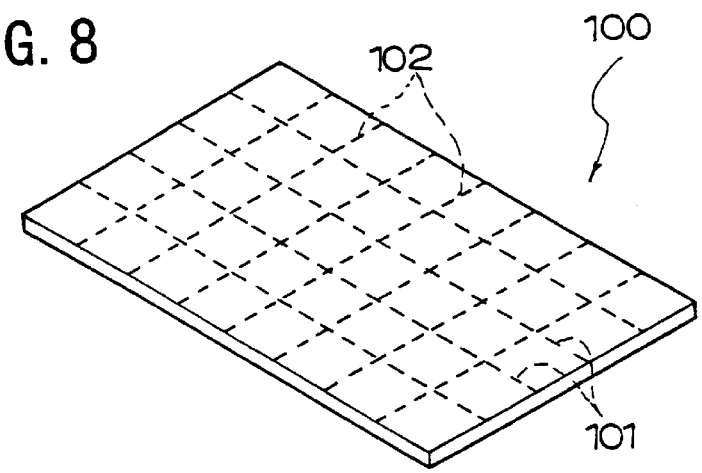
FIG. 8 is a perspective view of a CSP plate.

The CSP plate carrier 55 comprises a third lateral guide rail 56 extending in the Y-axial direction, an associated self-running drive 57 movable along the lateral guide rail 56 and a rising-and-descending carrier 58 movably mounted to the drive 57. The rising-and-descending carrier 58 has suction means 59 on its lower surface. The carrier 58 descends until its suction means is put on the CSP plate 11 in the tentative storage area 54, and then, the CSP plate 11 is sucked and held onto the rising-and-descending carrier 58. The CSP plate 11 is raised and, at the same time, is moved in the Y-axial direction to be brought just above the jig 14a on the jig taking in-and -out table 36. Finally the rising-and-descending carrier 58 descends to put the CSP plate 11 on the jig 14a, and the CSP plate 11 is released from the suction means 59, so that it may be left on the jig 14a, as seen from FIG. 7.

Then, the CSP plate-and-jig combination is transported to the machining table 61 by the first transporting means 60.

The first transporting means 60 comprises a longitudinal bridge-like elongation 62 extending above from the jig taking in-and -out table 36 above to the machining table 61 in the X-axial direction, and a jig carrier 63 movable along the bridge-like elongation 62 in the X-axial direction and up and down in the Z-axial direction. The jig carrier 63 has three suction pipes 64 for holding the jig.

These suction pipes 64 are fitted in the three vents 29, 30 and 31 of the jig 14a (see FIG. 2) to hold it. Negative pressure from the vents 29, 30 and 31 is applied to the CSP plate 11 via the duct channels 32 and the second suction holes 21 (see FIG. 4). Thus, the jig 14a can be transported in the X-axial direction by the jig carrier 63 with its suction pipes 64 fitted in the vents 29, 30 and 31. When the plate-and-jig combination is brought above the machining table 61, the jig carrier 63 descends, and the suction pipes 64 are put apart from the jig 14a to release the plate-and-jig combination, thus remaining on the machining table 61. Then, air is drawn from the first through-holes 20 of the jig 14a to the center suction hole 65 of the machining table 61 to positively hold the plate-and-jig combination on the machining table 61.

The machining table 61 is moved in the X-axial direction to carry the plate-and-jig combination under the alignment means 66, and the longitudinal cutting lines 16 of the CSP plate 11 are detected to put the plate-and-jig combination in alignment with the cutting blade 67 in the Y-axial direction.

When the machining table 61 is moved in the X-axial direction, the CSP plate 11 is cut along a selected longitudinal cutting line with the cutting blade 67 of the cutting means 68. Every time the CSP plate 11 has been cut along the longitudinal cutting line, the CSP plate 11 is displaced the inter-cutting line distance by the cutting means 68 laterally in the Y-axial direction, and the CSP plate 11 is moved longitudinally in the X-axial direction. Then, the CSP plate 11 is cut longitudinally along the adjacent longitudinal cutting line 16. Thus, the CSP plate 11 is cut longitudinally every time the lateral incremental displacement and subsequent longitudinal reciprocation of the machining table 61 has been made.

When all longitudinal cutting lines 16 are cut, the machining table 61 is rotated 90 degrees, and the cutting is repeated along all lateral cutting lines 17 in the same way as described above, thereby separating the CSP plate 11 into individual CSPs or pellets.

The jig 14a having the so pelletized CSP plate held thereon is brought to the washing table 70 by the second transporting means 69, which is composed of an arm 71 movable both in the X- and Y-axial directions and a rising-and-descending carrier 72 fixed to the end of the arm 71. The rising-and-descending carrier 72 is equipped with three suction pipes 73, which are to be fitted in the vent holes 29, 30 and 31 of the jig 14a, as is the case with the first transporting means 60. When the pelletized CSP plate-and-jig combination is transported to the washing table 70 each and every pellet is sucked and held on the jig 14a by drawing air from the vent holes 29, 30 and 31 through the first and second suction holes 20 and 21 of the jig 14a.

The washing table 70 has substantially same structure as the machining table 61, and it can be rotated. When the jig 14a having the pelletized CSP plate held thereon is rotated, water is flushed on the spinning table 70 to remove debris, and then, the jig 14a and the pelletized CSP plate 11 are exposed to pressurized air for drying.

After finishing the washing and drying of the pellet-bearing jig 14a it is transported to the pellet picking-up table 75 by the third transporting means 74, which is composed of a longitudinal bridge-like elongation 76 extending in the X-axial direction, a lateral arm 77 capable of moving along the longitudinal bridge-like elongation 76 and of rising and descending in the Z-axial direction, and a carrier 78 fixed to the end of the lateral arm 77. The carrier 78 is equipped with three suction pipes 79, which can be fitted in the vent holes 29, 30 and 31 of the jig 14a. As is the case with the first and second transporting means 60 and 69, the pelletized CSP plate 11 is sucked and held on the jig 14a, and the jig 14a along with the pelletized CSP plate 11 is brought to the pellet picking-up table 75 in the X-axial direction, and then the lateral arm 77 descends, and the suction pipes 79 are moved apart from the jig 14a to release the jig 14a with the pelletized CSP plate laid thereon, thus allowing them to lie on the pellet picking-up table 75.

There is the pellet transferring area 80 in the vicinity of the pellet picking-up table 75. In the pellet transferring area 80 individual pellets are transferred from the jig 14a to a pellet carrier tray 90 by a pellet transferring means 81 which extends from the pellet picking-up table 75 to the pellet transferring area 80 above the top surface of these areas.

The pellet transferring means 81 comprises a longitudinal bridge-like elongation 82 extending in the X-axial direction and two pick-up means 83 which can move along the longitudinal bridge-like elongation, and can rise and descend in the Z-axial direction. Each pick-up means 83 has suction means 84 equipped therewith for sucking a selected pellet or CSP from the jig 14a.

The pellet picking-up table 75 is movable in the Y-axial direction to put a CSP plate at an appropriate position. The table 75 is rotatable too.

In the pellet transferring area 80 there is a first tray-transporting table 85, which is movable both in the Y-axial direction and in the Z-axial direction, and an empty tray 86 is laid on the first tray-transporting table 85. The table 85 can descend and move within the apparatus to crawl under the first tray rack 87.

A plurality of empty trays 86 are stored in the first tray rack 87, and these trays 86 can be taken out one after another from the bottom of the pile of trays in the first tray rack 87. The tray 86 thus taken out is put on the first tray-transporting table 85, and is put in correct position in the pellet transferring area 80.

In transferring pellets, first, the pellet picking-up table 75 is moved in the Y-axial direction so that a selected pellet is put underneath the suction means 84 of one of the pick-up means 83, and then, the pick-up means 83 is lowered to permit the suction means 84 to suck and hold the pellet. The pick-up means 83 is raised with the pellet held on the suction means 84.

On the other hand the tray 86 is moved in the Y-axial direction together with the first tray transporting table 85, and at the same time, the pick-up means 83 is moved in the +X-axial direction. These X- and Y-axial movements are so controlled that the suction means 83 holding the pellet on its end may be put above a selected empty cell of the tray 86, lowering and releasing the pellet to the selected empty cell in the tray 86.

This transferring operation is repeated until the tray 86 is loaded with pellets. The two pick-up means 83 are so controlled as to work in parallel, thereby expediting the loading with efficiency.

When all pellets are removed from the jig 14a, the pellet picking-up table 75 is rotated 90 degrees, and then, it is moved in the +Y-axial direction to the jig storage area 88 (broken lines in FIG. 1). The empty jig 14a is transferred from the jig storage area 88 to the jig taking in- and -out table 36, and another selected CSP plate of same type is put on the table 36 to be subjected to the processing as described above.

When all CSP plates of same type are pelletized and packed into trays, the jigs 14a used are taken in the jig rack 15 to be replaced at the same address, i.e., No.1 as they were stored before taking out. Thus, same jigs can be reused as many times as required, not requiring the peeling-off and wasting of the adhesive tape from each of the jigs used. Accordingly the working efficiency is improved, and the cost involved is significantly saved.

A single jig is taken for description, but four jigs are, in fact, used simultaneously, working respectively in different phases.

The pellet carrier tray 90 loaded with pellets is transferred to the second tray table 92 by the transferring means 91, which is composed of a longitudinal guide rail 91a, an arm 93 movable along the guide rail 91a and a carrier 94 vertically movably attached to the end of the arm. The carrier 94 is lowered to grip the pellet-loaded tray 90, and then it is raised and at the same time, moved in the+X-axial direction to bring just above the second tray-transporting table 92. Then, the carrier 94 is lowered to release the pellet-loaded tray on the second tray-transporting table 92.

The second tray-transporting table 92 is movable both in the Y- and Z-axial directions like the first tray-transporting table 85, and the second tray-transporting table 92 moves within the apparatus to crawl under the second tray rack 95, pushing the pellet-loaded tray under the pile of pellet-loaded trays in the second tray rack 95.

Figure 9:
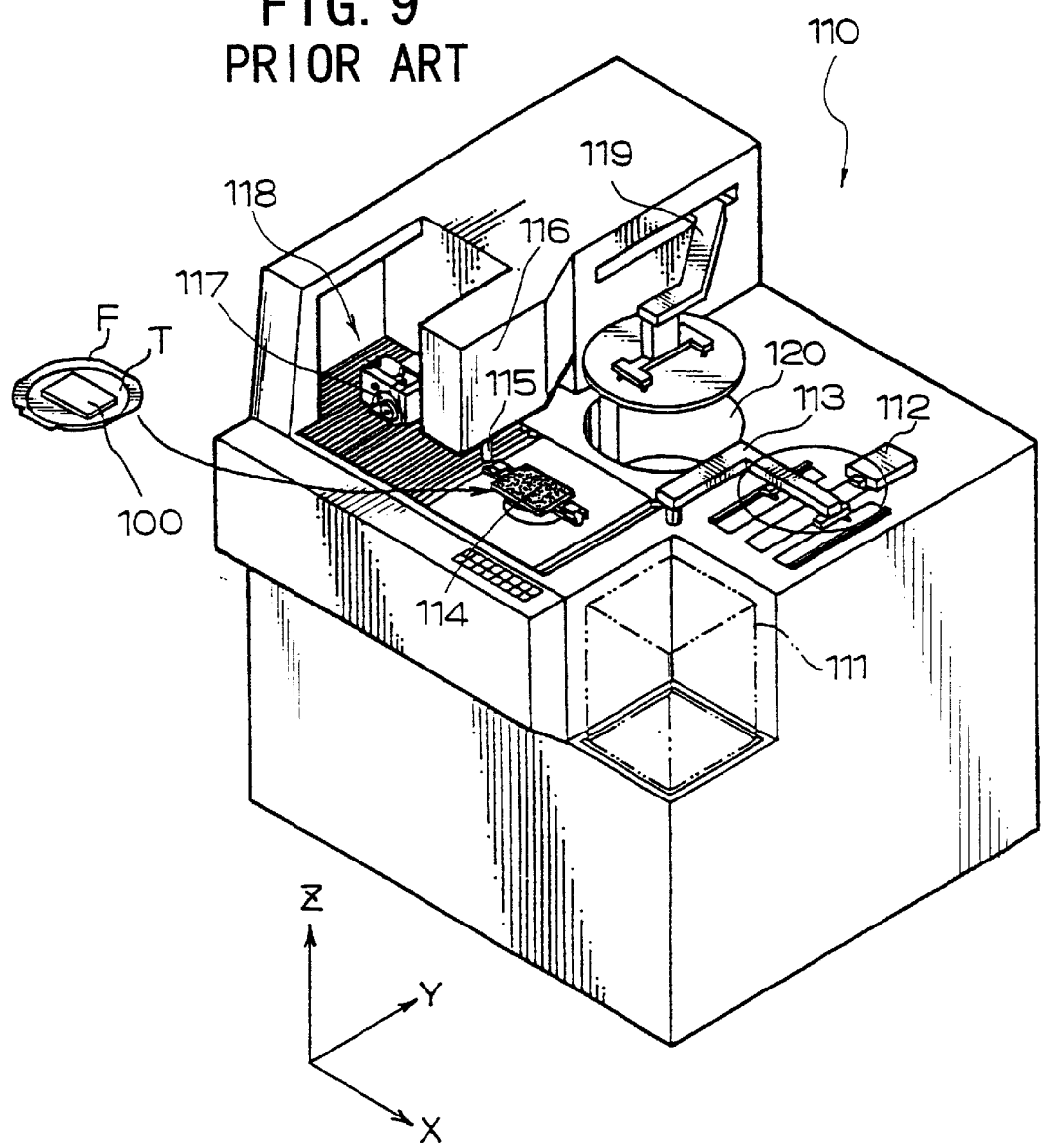
FIG. 9 is a perspective view of a dicing apparatus, which has been hitherto used in cutting CSP plates.

As may be understood from the above, the CSP plate pelletizing-and-loading apparatus 10 permits the pelletizing of CSP plates and the loading of trays with CSPs without transporting CSPs to a separate apparatus for loading trays with CSPs. Thus, all works can be done efficiently, significantly saving personnel expenses; extra workers would be allotted to the loading apparatus, which is placed apart from the dicing apparatus of FIG. 9.

In transporting CSP plate-and-jig combinations they are positively held by suction means, and therefore, there is no fear of allowing such combinations to fall on the way to a selected destination.

What is claimed is:

1. An apparatus for cutting CSP plates into individual pellets to put them on carrier trays for transportation comprising at least:

a jig rack for storing a plurality of jigs for holding CSP plates;

a jig taking-in and -out table means for taking a selected jig out from the jig rack to carry and transport the selected jig to an area in which CSP plates are brought and laid;

a cassette table on which a CSP plate cassette is put;

means for taking a selected CSP plate out from the cassette;

means for putting the taken-out, selected CSP plate on the selected jig, which is on the table means;

first transporting means for transporting the CSP plate-and-jig combination being held on the working table;

second transporting means for transporting the jig holding the CSP plate cut into individual pellets from the working table to a washing table;

third transporting means for transporting the washed cut CSP plate-and-jig combination from the washing table to a pellet picking-up table;

means for picking up individual pellets from the pellet picking-up table to put them in carrier trays, which are laid in a pellet transferring area; and fourth transporting means for transporting empty jigs from the pellet picking-up table to the jig taking-in and -out table means.

2. An apparatus according to claim 1 further comprising:

a first tray rack for storing empty carrier trays;

a second tray rack for storing pellet-loaded carrier trays;

a first tray-carrying table for transporting empty carrier trays from the first tray rack to the pellet transferring area;

a second tray-carrying table for transporting pellet-loaded carrier trays to the second tray track; and means for transferring pellet-loaded carrier trays from the first tray-carrying table to the second tray-carrying table.

3. An apparatus according to claim 1 or 2 wherein each jig has slots in the form of a lattice on a surface thereof, allowing the cutting blade to traverse the jig without being caught when the overlying CSP plate is being cut, each square defined by the lattice pattern having a first suction through-hole and second suction holes made therein, the first suction through-hole passing through the thickness of the jig to communicate with a suction source provided to the working table, the second suction holes communicating with vents made on selected sides of the jig for inserting suction pipes extending from duct passages made in the first, second and third transporting means, to permit the CSP plate to be held on the jig by suction.

4. An apparatus according to claim 3 wherein the suction pipes extending from the first, second and third transporting means are adapted to apply negative pressure to a selected CSP plate and at the same time, physically pinch an associated jig between confronting pipes for holding the jig.

* * * * *